(12) United States Patent
Huang et al.

(10) Patent No.: US 11,245,000 B1
(45) Date of Patent: Feb. 8, 2022

(54) METAL-INSULATOR-METAL CAPACITOR

(71) Applicant: United Semiconductor (Xiamen) Co., Ltd., Fujian (CN)

(72) Inventors: Ji He Huang, Suzhou (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 17/072,003

(22) Filed: Oct. 15, 2020

(30) Foreign Application Priority Data

Sep. 24, 2020 (CN) .......................... 202011015487.2

(51) Int. Cl.
*H01L 49/02* (2006.01)
*H01L 23/522* (2006.01)
*H01L 21/768* (2006.01)

(52) U.S. Cl.
CPC .......... *H01L 28/56* (2013.01); *H01L 23/5223* (2013.01); *H01L 23/5226* (2013.01); *H01L 28/40* (2013.01); *H01L 28/60* (2013.01); *H01L 28/75* (2013.01); *H01L 28/91* (2013.01); *H01L 21/76802* (2013.01); *H01L 21/76807* (2013.01)

(58) Field of Classification Search
CPC ........... H01L 23/5226; H01L 21/76802; H01L 21/76805; H01L 21/76807; H01L 21/76897; H01L 28/56; H01L 28/60; H01L 28/75; H01L 28/91; H01L 27/0805; H01L 23/5223; H01L 28/40
See application file for complete search history.

(56) References Cited

U.S. PATENT DOCUMENTS

| | | | |
|---|---|---|---|
| 6,391,713 B1* | 5/2002 | Hsue | H01L 21/76807 257/E21.009 |
| 6,583,491 B1* | 6/2003 | Huang | H01L 28/55 257/311 |
| 2013/0264681 A1* | 10/2013 | Tu | H01L 21/00 257/532 |
| 2015/0325635 A1* | 11/2015 | Zang | H01L 23/5223 257/532 |

* cited by examiner

*Primary Examiner* — Jose R Diaz
(74) *Attorney, Agent, or Firm* — Winston Hsu

(57) ABSTRACT

An MIM capacitor includes a semiconductor substrate having a conductor layer thereon, a dielectric layer overlying the semiconductor substrate and the conductor layer, and a first capacitor electrode disposed on the dielectric layer. The first capacitor electrode partially overlaps with the conductor layer when viewed from above. A capacitor dielectric layer is disposed on the first capacitor electrode. A second capacitor electrode is disposed on the capacitor dielectric layer. At least one via is disposed in the dielectric layer and electrically connecting the first capacitor electrode with the conductor layer.

20 Claims, 4 Drawing Sheets

METAL-INSULATOR-METAL CAPACITOR

BACKGROUND OF THE INVENTION

1. Field of the Invention

The present invention relates to the field of semiconductor technology, and in particular to a metal-insulator-metal (MIM) capacitor.

2. Description of the Prior Art

Various capacitive structures are used as electronic elements in integrated circuits such as radio frequency integrated circuits (RFIC), and monolithic microwave integrated circuits (MIMIC). Such capacitive structures include, for example, metal-oxide-semiconductor (MOS) capacitors, p-n junction capacitors and metal-insulator-metal (MIM) capacitors.

For some applications, MIM capacitors can provide certain advantages over MOS and p-n junction capacitors because the frequency characteristics of MOS and p-n junction capacitors may be restricted as a result of depletion layers that form in the semiconductor electrodes.

An MIM capacitor can exhibit improved frequency and temperature characteristics. Furthermore, MIM capacitors are formed in the metal interconnect layers, thereby reducing CMOS transistor process integration interactions or complications. However, the prior art MIM capacitor occupies a larger chip area, and the lower electrode plate of the capacitor usually extends beyond the range of the upper electrode plate, resulting in a waste of ineffective area (area that does not contribute to the capacitance value).

SUMMARY OF THE INVENTION

It is one object of the present invention to provide an improved MIM capacitor to solve the deficiencies or shortcomings of the prior art.

One aspect of the invention provides a metal-insulator-metal (MIM) capacitor including a substrate having a conductor layer thereon, a dielectric layer overlying the substrate and the conductor layer, a first capacitor electrode disposed on the dielectric layer, a capacitor dielectric layer disposed on the first capacitor electrode, a second capacitor electrode disposed on the capacitor dielectric layer; and at least one via disposed in the dielectric layer and electrically connecting the first capacitor electrode with the conductor layer. The first capacitor electrode partially overlaps with the conductor layer when viewed from above.

According to some embodiments, the conductor layer is a copper damascene layer.

According to some embodiments, the dielectric layer comprises a silicon nitride layer on the copper damascene layer and a silicon oxide layer on the silicon nitride layer.

According to some embodiments, the silicon nitride layer is in direct contact with the copper damascene layer.

According to some embodiments, the MIM capacitor comprises four sidewalls above the dielectric layer, and each of which comprises a sidewall of the first capacitor electrode, a sidewall of the capacitor dielectric layer, and a sidewall of the second capacitor electrode.

According to some embodiments, the sidewall of the first capacitor electrode is flush with the sidewall of the capacitor dielectric layer in a vertical direction, and wherein the sidewall of the capacitor dielectric layer is flush with the sidewall of the second capacitor electrode in the vertical direction.

According to some embodiments, an etch stop layer is conformally deposited over the second capacitor electrode, the sidewall of the second capacitor electrode, the sidewall of the capacitor dielectric layer, the sidewall of the first capacitor electrode, and the dielectric layer.

According to some embodiments, an inter-layer dielectric (ILD) layer is deposited on the etch stop layer.

According to some embodiments, the conductor layer extends beyond the sidewall of the first capacitor electrode.

According to some embodiments, a first contact structure is disposed in proximity to the MIM capacitor and penetrates through the ILD layer and the etch stop layer, and wherein the first contact structure is electrically connected to the conductor layer.

According to some embodiments, a second contact structure is disposed directly above the second capacitor electrode, and penetrates through the ILD layer and the etch stop layer, and wherein the second contact structure is electrically connected to the second capacitor electrode.

According to some embodiments, the at least one via comprises tungsten.

According to some embodiments, an area occupied by the first capacitor electrode is equal to an area occupied by the second capacitor electrode.

According to some embodiments, the first capacitor electrode does not protrude beyond the sidewall of the second capacitor electrode.

According to some embodiments, the first capacitor electrode comprises an aluminum layer, a titanium layer on the aluminum layer, and a titanium nitride layer on the titanium layer.

According to some embodiments, the second capacitor electrode comprises a titanium nitride layer.

According to some embodiments, the capacitor dielectric layer comprises an oxide-nitride-oxide (ONO) layer.

According to some embodiments, the MIM capacitor further includes a cap layer disposed on the second capacitor electrode.

According to some embodiments, the cap layer is a silicon nitride layer.

According to some embodiments, the first capacitor electrode and the second capacitor electrode are made of metal, and the capacitor dielectric layer is made of an insulating layer, whereby the first capacitor electrode, the capacitor dielectric layer, and the second capacitor electrode constitute a metal-insulator-metal capacitor structure on the dielectric layer.

According to some embodiments, the metal comprises titanium nitride, titanium, aluminum or a combination thereof.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient details to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a metal-insulator-metal (MIM), which can be applied to devices such as mixed-signal circuits, radio frequency circuits, low-noise amplifiers, voltage-controlled oscillators, or power amplifiers. For example, MIM capacitors are critical in several mixed signal integrated circuits such as analog frequency tuning circuits, switched capacitor circuits, filters, resonators, up-conversion and down-conversion mixers, and A/D converters. Smaller MIM capacitors are desirable from the standpoint of lower power consumption and increased feature density in a semiconductor chip.

Figure 1:
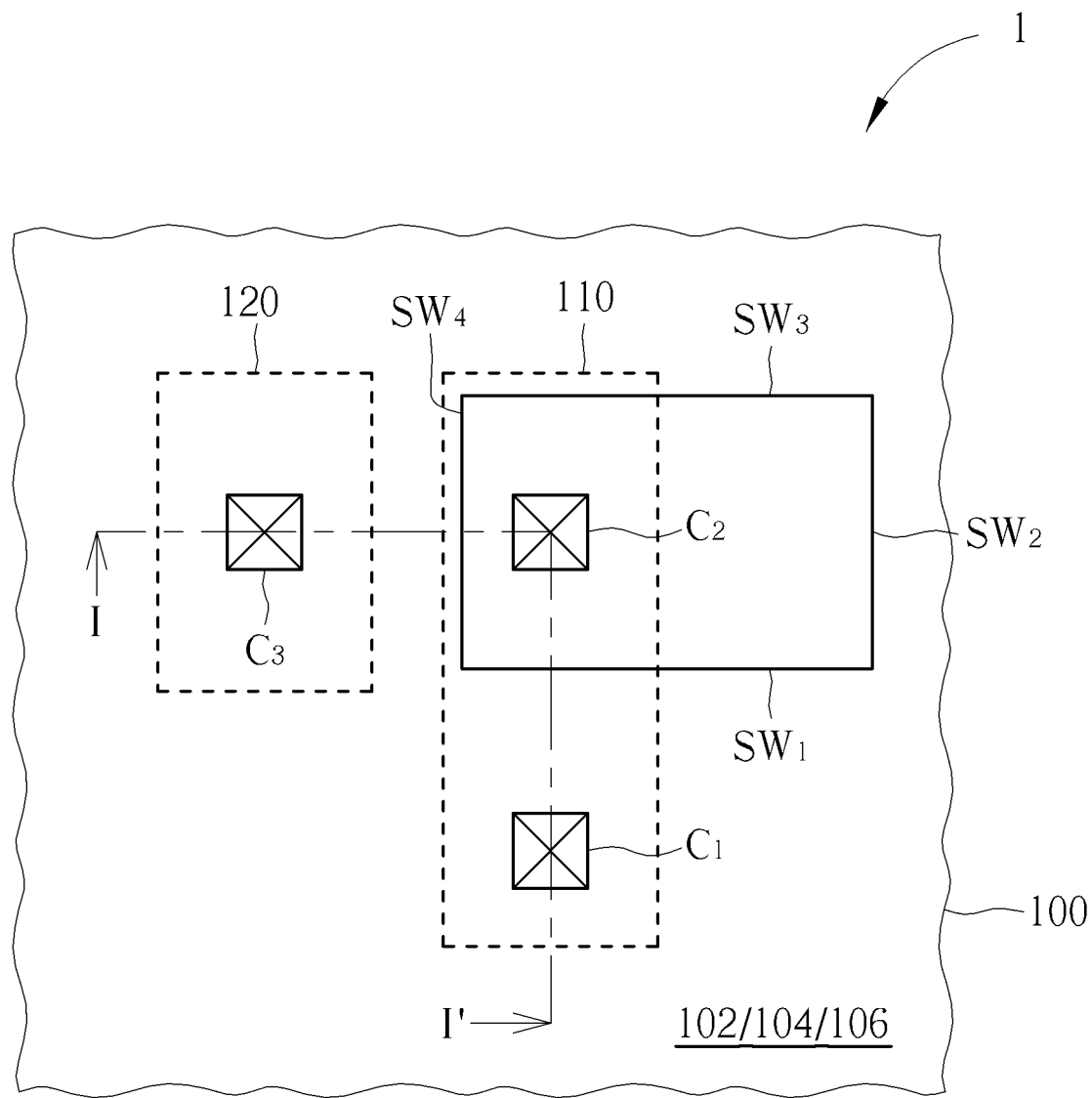
FIG. 1 is a top view of a MIM capacitor according to an embodiment of the invention.
Figure 2:
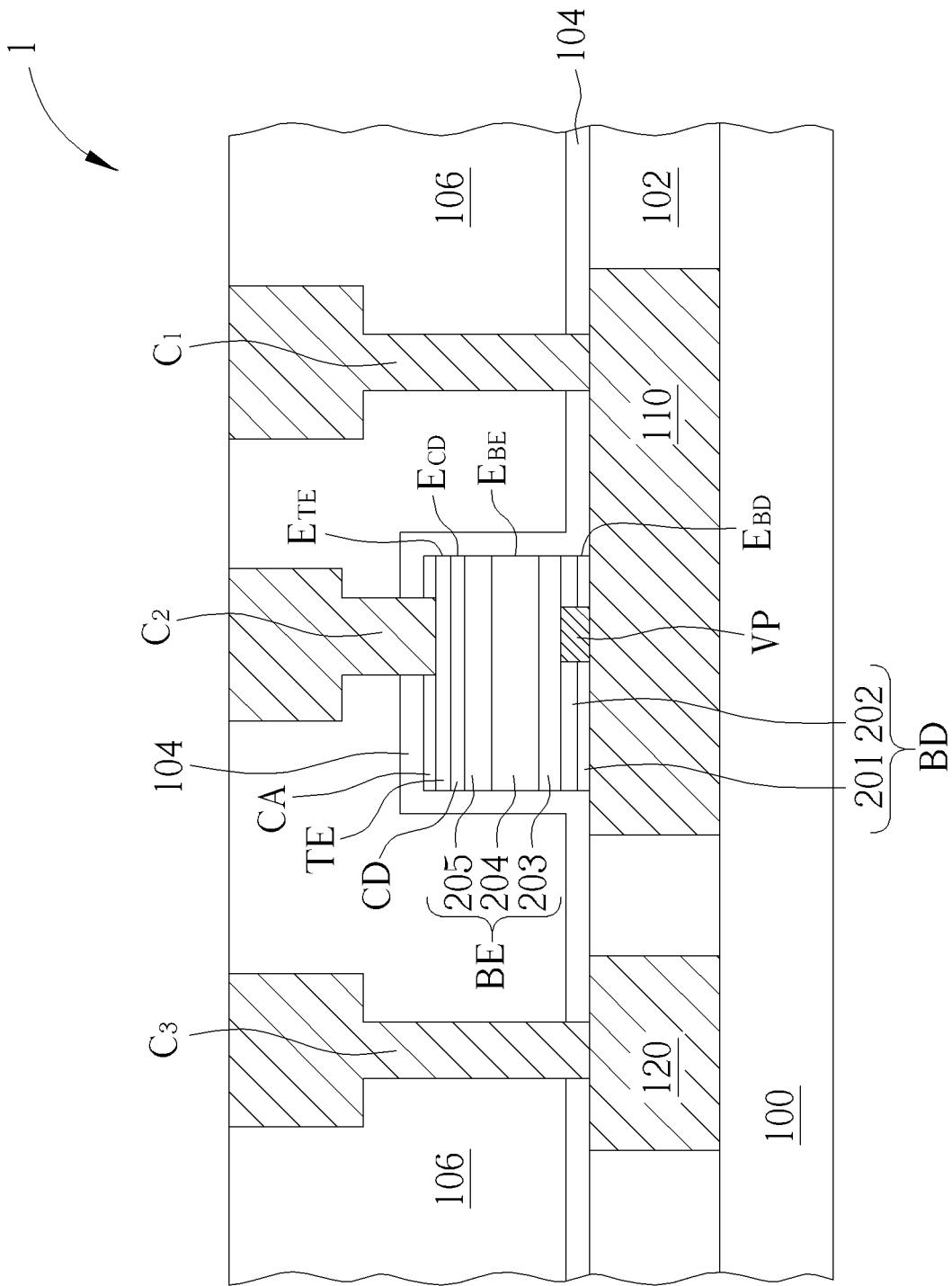
FIG. 2 is a cross-sectional view taken along the line I-I' in FIG. 1.
Figure 3:
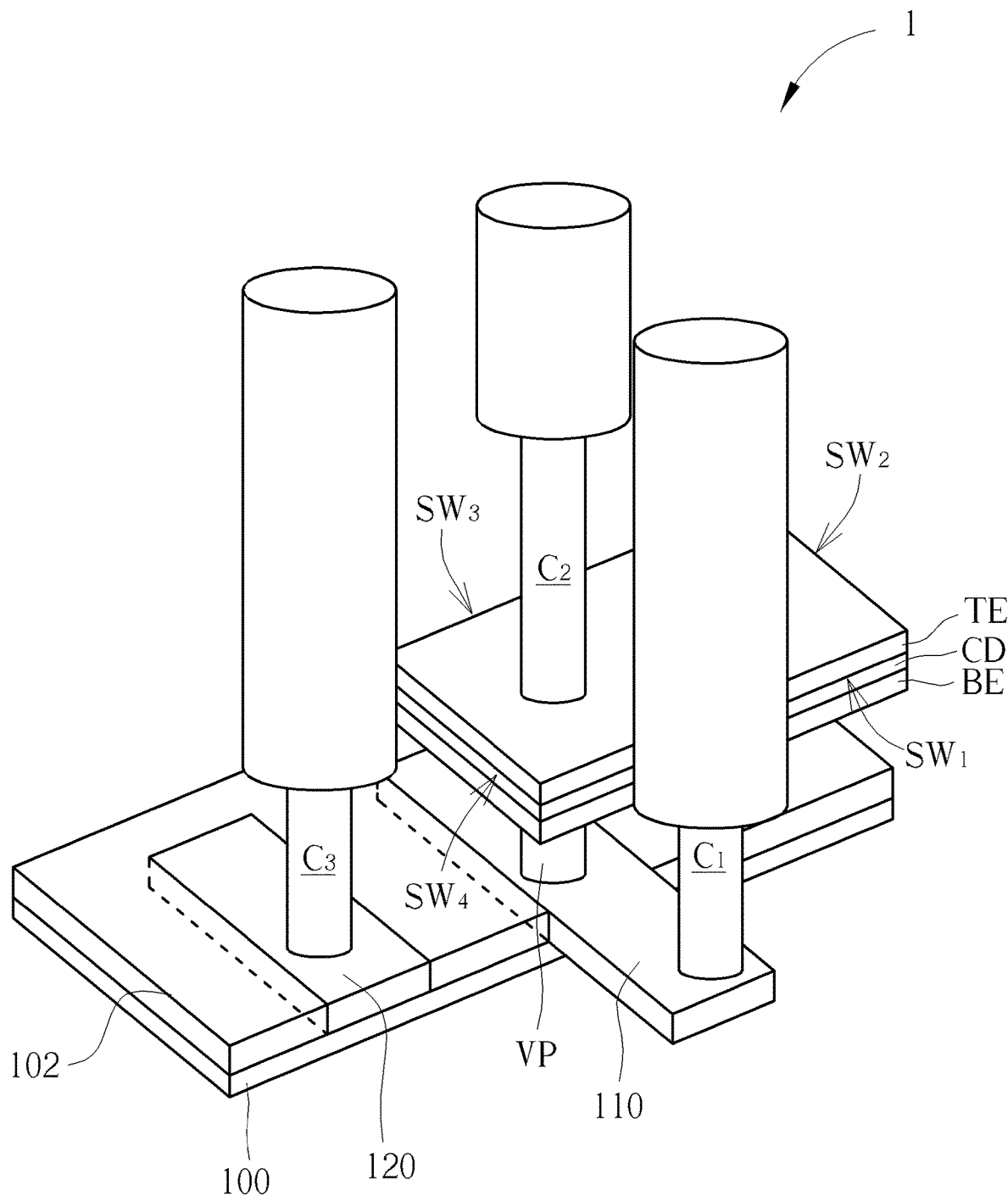
FIG. 3 illustrates a perspective side view of a MIM capacitor.

Please refer to FIG. 1 to FIG. 3, in which FIG. 1 is a top view of a MIM capacitor according to an embodiment of the present invention, FIG. 2 is a cross-sectional view taken along the line I-I' in FIG. 1, and FIG. 3 illustrates a perspective side view of a MIM capacitor. As shown in FIG. 1 to FIG. 3, the MIM capacitor 1 includes a substrate 100 having a conductive layer 110 thereon. According to an embodiment of the present invention, the substrate 100 may include a semiconductor substrate, such as a silicon substrate, but is not limited thereto. According to an embodiment of the present invention, for example, the conductive layer 110 may be a copper damascene layer, but is not limited thereto. According to an embodiment of the present invention, the conductive layer 110 may be formed in a dielectric layer 102. According to an embodiment of the present invention, for example, the dielectric layer 102 may be a low-k dielectric layer or an ultra low-k dielectric layer, but is not limited thereto. According to an embodiment of the present invention, for example, the dielectric constant of the dielectric layer 102 may be less than 2.8, but is not limited thereto.

According to an embodiment of the present invention, another conductive layer 120 may be provided on the substrate 100 adjacent to the conductive layer 110. According to an embodiment of the present invention, for example, the conductive layer 120 may be a copper damascene layer, but is not limited thereto. According to an embodiment of the present invention, the conductive layer 120 is also formed in the dielectric layer 102, that is, the conductive layer 110 and the conductive layer 120 are formed in the same layer of metal interconnection.

As shown in FIG. 2, the MIM capacitor 1 includes a dielectric layer BD covering the substrate 100 and the conductive layer 110. According to an embodiment of the present invention, for example, the dielectric layer BD includes a silicon nitride layer 201 on the conductor layer 110 and a silicon oxide layer 202 on the silicon nitride layer 201. According to an embodiment of the present invention, the silicon nitride layer 201 is in direct contact with the conductor layer 110.

As shown in FIG. 2, the MIM capacitor 1 further includes a first capacitor electrode BE disposed on the dielectric layer BD. When viewed from above, as shown in FIG. 1 and FIG. 3, the first capacitor electrode BE partially overlaps with the conductor layer 110. According to an embodiment of the present invention, the MIM capacitor 1 further includes a capacitor dielectric layer CD disposed on the first capacitor electrode BE. According to an embodiment of the present invention, the MIM capacitor 1 further includes a second capacitor electrode TE disposed on the capacitor dielectric layer CD.

According to an embodiment of the present invention, the first capacitor electrode BE may have a multilayer structure, for example, including: an aluminum (Al) layer 203, a titanium (Ti) layer 204 on the aluminum layer 203, and a titanium nitride (TiN) layer 205 on the titanium layer 204. However, the first capacitor electrode BE may also have a single-layer structure, for example, titanium nitride, titanium, aluminum, or a combination thereof. According to an embodiment of the present invention, the second capacitor electrode TE may include a titanium nitride layer with a thickness of about 600 angstroms, but is not limited thereto. According to an embodiment of the present invention, the capacitor dielectric layer CD may include an oxide-nitride-oxide (ONO) layer with a thickness of about 350 angstroms, but is not limited thereto.

As shown in FIG. 2 and FIG. 3, the MIM capacitor 1 further includes at least one conductive via VP, which is provided in the dielectric layer BD and located directly under the first capacitor electrode BE. For the sake of clarity, the dielectric layer BD, the etch stop layer 104 and the ILD layer 106 are omitted in FIG. 3. According to an embodiment of the present invention, the conductive via VP electrically connects the first capacitor electrode BE to the conductor layer 110. According to an embodiment of the present invention, the conductive via VP includes tungsten, but is not limited thereto.

According to an embodiment of the present invention, as shown in FIG. 1 and FIG. 3, the MIM capacitor 1 may be a rectangular parallelepiped, including four sidewalls SW1 to SW4 above the dielectric layer 102, and each of the sidewalls SW1 to SW4 includes a sidewall $E_{BE}$ of the first capacitor electrode BE, a sidewall $E_{CD}$ of the capacitor dielectric layer CD, and a sidewall $E_{TE}$ of the second capacitor electrode TE. According to an embodiment of the present invention, the sidewall $E_{BE}$ of the first capacitor electrode BE is flush with the sidewall $E_{CD}$ of the capacitor dielectric layer CD in the vertical direction, and the sidewall $E_{CD}$ of the capacitor dielectric layer CD is flush with the sidewall $E_{TE}$ of the second capacitor electrode TE. In addition, the sidewall $E_{BE}$ of the first capacitor electrode BE is flush with the sidewall $E_{BD}$ of the dielectric layer BD in the vertical direction.

According to an embodiment of the present invention, the area occupied by the first capacitor electrode BE is equal to the area occupied by the second capacitor electrode TE. According to an embodiment of the present invention, the first capacitor electrode BE does not protrude beyond the sidewall $E_{TE}$ of the second capacitor electrode TE. In this way, the MIM capacitor 1 can occupy a smaller chip area. According to an embodiment of the present invention, the conductive layer 110 extends beyond the sidewall $E_{BE}$ of the first capacitor electrode BE.

According to an embodiment of the present invention, as shown in FIG. 2, an etch stop layer 104 is conformally deposited on the second capacitor electrode TE, on the sidewall $E_{TF}$ of the second capacitor electrode TE, on the sidewall $E_{CD}$ of the capacitor dielectric layer CD, on the sidewall $E_{BE}$ of the first capacitor electrode BE, and on the sidewall $E_{BD}$ of the dielectric layer BD. According to an embodiment of the present invention, the etch stop layer 104 may be a silicon nitride layer with a thickness of about 400 angstroms, but is not limited thereto. According to an embodiment of the present invention, an interlayer dielectric (ILD) layer 106 may be deposited on the etch stop layer 104.

According to an embodiment of the present invention, the MIM capacitor 1 further includes a cap layer CA disposed on the second capacitor electrode TE. According to an embodiment of the present invention, the cap layer CA may be a silicon nitride layer. According to an embodiment of the present invention, for example, the thickness of the cap layer CA is about 700~1050 angstroms, but it is not limited thereto.

According to an embodiment of the present invention, as shown in FIG. 1 to FIG. 3, a first contact structure $C_1$ is provided adjacent to the MIM capacitor 1, and the first contact structure $C_1$ penetrates through the ILD layer 106 and the etch stop layer 104 and is electrically connected to the conductor layer 110. According to an embodiment of the present invention, for example, the first contact structure $C_1$ may be a copper damascene structure formed by a dual damascene process, but is not limited thereto.

According to an embodiment of the present invention, a second contact structure $C_2$ is provided directly above the second capacitor electrode TE, and the second contact structure $C_2$ penetrates through the ILD layer 106, the etch stop layer 104 and the cap layer CA, and is electrically connected to the second capacitor electrode TE. According to an embodiment of the present invention, for example, the second contact structure $C_2$ may be a copper damascene structure formed by a dual damascene process, but is not limited thereto.

According to an embodiment of the present invention, as shown in FIG. 1 to FIG. 3, a third contact structure $C_3$ is additionally provided in proximity to the MIM capacitor 1, and the third contact structure $C_3$ penetrates through the ILD layer 106 and the etch stop layer 104, and is electrically connected to the conductor layer 120. According to an embodiment of the present invention, for example, the third contact structure $C_3$ may be a copper damascene structure formed by a dual damascene process, but is not limited thereto.

Figure 4:
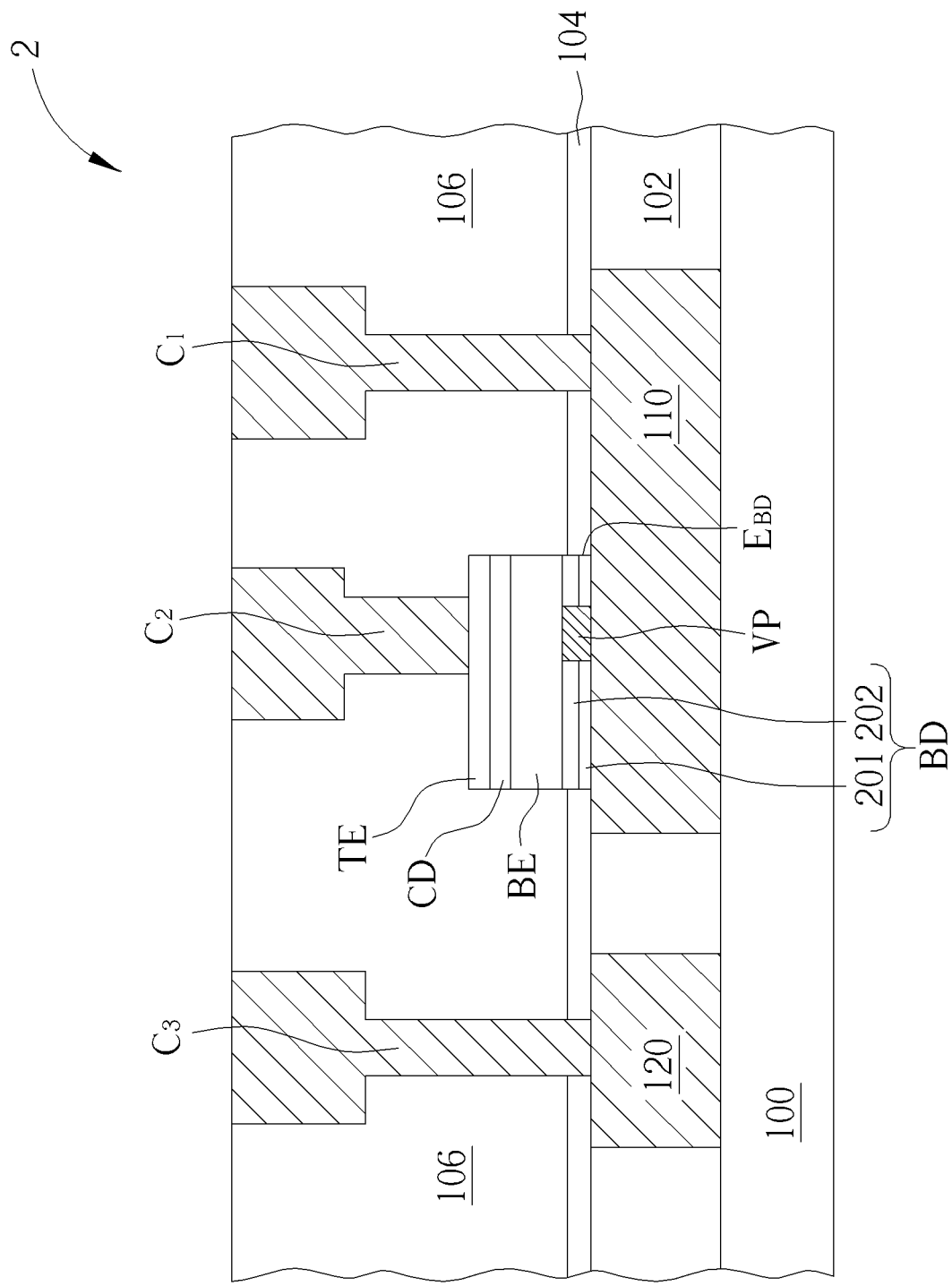
FIG. 4 is a schematic cross-sectional view of a MIM capacitor according to another embodiment of the present invention

Please refer to FIG. 4, which is a schematic cross-sectional view of a MIM capacitor according to another embodiment of the present invention, in which the like regions, layers or elements are designated by like numeral numbers or labels. The difference between the MIM capacitor 2 in FIG. 4 and the MIM capacitor 1 in FIG. 2 is that the second capacitor electrode TE of the MIM capacitor 2 in FIG. 4 does not need to be provided with a cap layer CA, and there is no etching stop layer thereon. According to an embodiment of the present invention, likewise, the MIM capacitor 2 includes a first capacitor electrode BE, a capacitor dielectric layer CD, and a second capacitor electrode TE. The first capacitor electrode BE and the second capacitor electrode TE may be made of metal, for example, titanium nitride, titanium, aluminum or a combination thereof, and the capacitor dielectric layer is made of an insulating layer. The first capacitor electrode BE, the capacitor dielectric layer CD, and the second capacitor electrode TE constitute a metal-insulator-metal capacitor structure on the dielectric layer BD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-insulator-metal (MIM) capacitor, comprising:
a substrate having a conductor layer thereon;
a patterned dielectric layer overlying the substrate and the conductor layer;
a first capacitor electrode disposed on the patterned dielectric layer, wherein the first capacitor electrode partially overlaps with the conductor layer when viewed from above;
a capacitor dielectric layer disposed on the first capacitor electrode;
a second capacitor electrode disposed on the capacitor dielectric layer;
at least one via disposed in the patterned dielectric layer and electrically connecting the first capacitor electrode with the conductor layer; and
an etch stop layer conformally deposited over the second capacitor electrode, wherein the etch stop layer is in direct contact with a sidewall of the second capacitor electrode, a sidewall of the capacitor dielectric layer, a sidewall of the first capacitor electrode, a sidewall of the patterned dielectric layer, and a top surface of the conductor layer.

2. The MIM capacitor according to claim 1, wherein the conductor layer is a copper damascene layer.

3. The MIM capacitor according to claim 2, wherein the patterned dielectric layer comprises a silicon nitride layer on the copper damascene layer and a silicon oxide layer on the silicon nitride layer.

4. The MIM capacitor according to claim 3, wherein the silicon nitride layer is in direct contact with the copper damascene layer.

5. The MIM capacitor according to claim 1, wherein the MIM capacitor comprises four sidewalls above the patterned dielectric layer, and each of which comprises the sidewall of the first capacitor electrode, the sidewall of the capacitor dielectric layer, and the sidewall of the second capacitor electrode.

6. The MIM capacitor according to claim 5, wherein the sidewall of the first capacitor electrode is flush with the sidewall of the capacitor dielectric layer in a vertical direction, and wherein the sidewall of the capacitor dielectric layer is flush with the sidewall of the second capacitor electrode in the vertical direction, and wherein the sidewall of the patterned dielectric layer is flush with the sidewall of the first capacitor electrode in the vertical direction.

7. The MIM capacitor according to claim 5, wherein the first capacitor electrode does not protrude beyond the sidewall of the second capacitor electrode.

8. The MIM capacitor according to claim 1, wherein an inter-layer dielectric (ILD) layer is deposited on the etch stop layer.

9. The MIM capacitor according to claim 8, wherein the conductor layer extends beyond the sidewall of the first capacitor electrode.

10. The MIM capacitor according to claim 9, wherein a first contact structure is disposed in proximity to the MIM capacitor and penetrates through the ILD layer and the etch stop layer, and wherein the first contact structure is electrically connected to the conductor layer, and wherein the first contact structure does not penetrate through the patterned dielectric layer.

11. The MIM capacitor according to claim 10, wherein a second contact structure is disposed directly above the second capacitor electrode, and penetrates through the ILD layer and the etch stop layer, and wherein the second contact structure is electrically connected to the second capacitor electrode.

12. The MIM capacitor according to claim 1, wherein the at least one via comprises tungsten.

13. The MIM capacitor according to claim 1, wherein an area occupied by the first capacitor electrode is equal to an area occupied by the second capacitor electrode.

14. The MIM capacitor according to claim 1, wherein the first capacitor electrode comprises an aluminum layer, a titanium layer on the aluminum layer, and a titanium nitride layer on the titanium layer.

15. The MIM capacitor according to claim 1, wherein the second capacitor electrode comprises a titanium nitride layer.

16. The MIM capacitor according to claim 1, wherein the capacitor dielectric layer comprises an oxide-nitride-oxide (ONO) layer.

17. The MIM capacitor according to claim 1 further comprising:

a cap layer disposed on the second capacitor electrode.

18. The MIM capacitor according to claim 17, wherein the cap layer is a silicon nitride layer.

19. The MIM capacitor according to claim 1, wherein the first capacitor electrode and the second capacitor electrode are made of metal, and the capacitor dielectric layer is made of an insulating layer, whereby the first capacitor electrode, the capacitor dielectric layer, and the second capacitor electrode constitute a metal-insulator-metal capacitor structure on the dielectric layer.

20. The MIM capacitor according to claim 19, wherein the metal comprises titanium nitride, titanium, aluminum or a combination thereof.

* * * * *